(12) United States Patent
Handy et al.

(10) Patent No.: US 12,272,945 B2
(45) Date of Patent: Apr. 8, 2025

(54) METHOD AND APPARATUS FOR DV/DT CONTROLLED RAMP-ON IN MULTI-SEMICONDUCTOR SOLID-STATE POWER CONTROLLERS

(71) Applicant: GE AVIATION SYSTEMS LIMITED, Gloucestershire (GB)

(72) Inventors: Peter James Handy, Cheltenham (GB); Ian David Johnson, Thornbury (GB); Nicholas George Tembe, Worcester (GB)

(73) Assignee: GE AVIATION SYSTEMS LIMITED, Gloucestershire (GB)

( * ) Notice: Subject to any disclaimer, the term of this patent is extended or adjusted under 35 U.S.C. 154(b) by 318 days.

(21) Appl. No.: 17/897,339

(22) Filed: Aug. 29, 2022

(65) Prior Publication Data

US 2023/0155373 A1    May 18, 2023

(30) Foreign Application Priority Data

Nov. 16, 2021    (EP) .................................... 21208643

(51) Int. Cl.
*H02H 9/04* (2006.01)
*H02H 9/00* (2006.01)
*H03K 17/0812* (2006.01)

(52) U.S. Cl.
CPC ............ *H02H 9/041* (2013.01); *H02H 9/005* (2013.01); *H03K 17/0812* (2013.01)

(58) Field of Classification Search
CPC ..... H02H 9/041; H02H 9/005; H03K 17/0812
See application file for complete search history.

(56) References Cited

U.S. PATENT DOCUMENTS

| | | | |
|---|---|---|---|
| 7,747,879 B2 | 6/2010 | Tofigh | |
| 7,925,910 B2 | 4/2011 | Lee | |
| 8,412,966 B2 | 4/2013 | Tofigh | |
| 10,048,997 B2 | 8/2018 | Manojlovic | |
| 10,250,033 B2 | 4/2019 | Dickey | |
| 10,725,436 B2 | 7/2020 | Dickey | |
| 2004/0140833 A1* | 7/2004 | Kim | H03K 17/166 327/170 |
| 2006/0071559 A1 | 4/2006 | Hanson | |
| 2011/0309809 A1* | 12/2011 | Rao | H02H 9/001 323/282 |

(Continued)

FOREIGN PATENT DOCUMENTS

| | | |
|---|---|---|
| EP | 2398146 | 12/2011 |
| EP | 3176895 | 6/2017 |

*Primary Examiner* — Kyle J Moody
(74) *Attorney, Agent, or Firm* — Fitch, Even, Tabin & Flannery LLP (57) ABSTRACT

Multi-semiconductor SSPCs that solve bus level problems affecting systems as well as controller level problems affecting individual multi-semiconductor SSPCs are disclosed. Bus level and controller level problems adversely affect multi-semiconductor SSPCs and their associated systems. The disclosed multi-semiconductor SSPCs solve both bus level and controller level problems by implementing controlled rate-change of voltage (dv/dt) ramp-on rate, to ensure that the voltage on the input bus does not collapse when a multi-semiconductor SSPC is commanded closed and that a minimum amount of power is being dissipated evenly across the switching semiconductors.

20 Claims, 12 Drawing Sheets

(56) References Cited

U.S. PATENT DOCUMENTS

| | | | |
|---|---|---|---|
| 2015/0061622 A1* | 3/2015 | Bhattad | G05F 1/573 323/280 |
| 2018/0358816 A1* | 12/2018 | Kondo | H02J 7/00714 |
| 2019/0199091 A1 | 6/2019 | Handy | |

* cited by examiner

TYPICAL WAVEFORMS FOR dV/dt LOW CAPACITIVE LOAD TURN-ON

FIG. 5

METHOD AND APPARATUS FOR DV/DT CONTROLLED RAMP-ON IN MULTI-SEMICONDUCTOR SOLID-STATE POWER CONTROLLERS

CROSS-REFERENCE TO RELATED APPLICATIONS

This application claims priority to EP Application No. 21208643.3, filed Nov. 16, 2021, entitled METHOD AND APPARATUS FOR DV/DT CONTROLLED RAMP-ON IN MULTI-SEMICONDUCTOR SOLID-STATE POWER CONTROLLERS, which is incorporated by reference in its entirety herein.

TECHNICAL FIELD

This application relates to control systems for power control devices, and, more specifically, to power control devices utilizing a controlled rate-change of output voltage for solid-state power controllers having multiple semiconductors for passing a current to a load.

BACKGROUND

Multi-semiconductor solid state power controllers (SSPCs) are used in many modern vehicle or craft applications. The purpose of multi-semiconductor SSPCs is to increase the reliability of a power controller during operation and to extend the useful life of the controller. If a single semiconductor device is used, and depending on the application, too much current may be passed through the one semiconductor resulting in high power dissipation across that semiconductor. High power dissipation across a semiconductor device will cause the semiconductor device to become unreliable and decrease its useful life. For that reason, in multi-semiconductor SSPCs the current demanded by a load is split between multiple semiconductor devices.

Figure 1A:
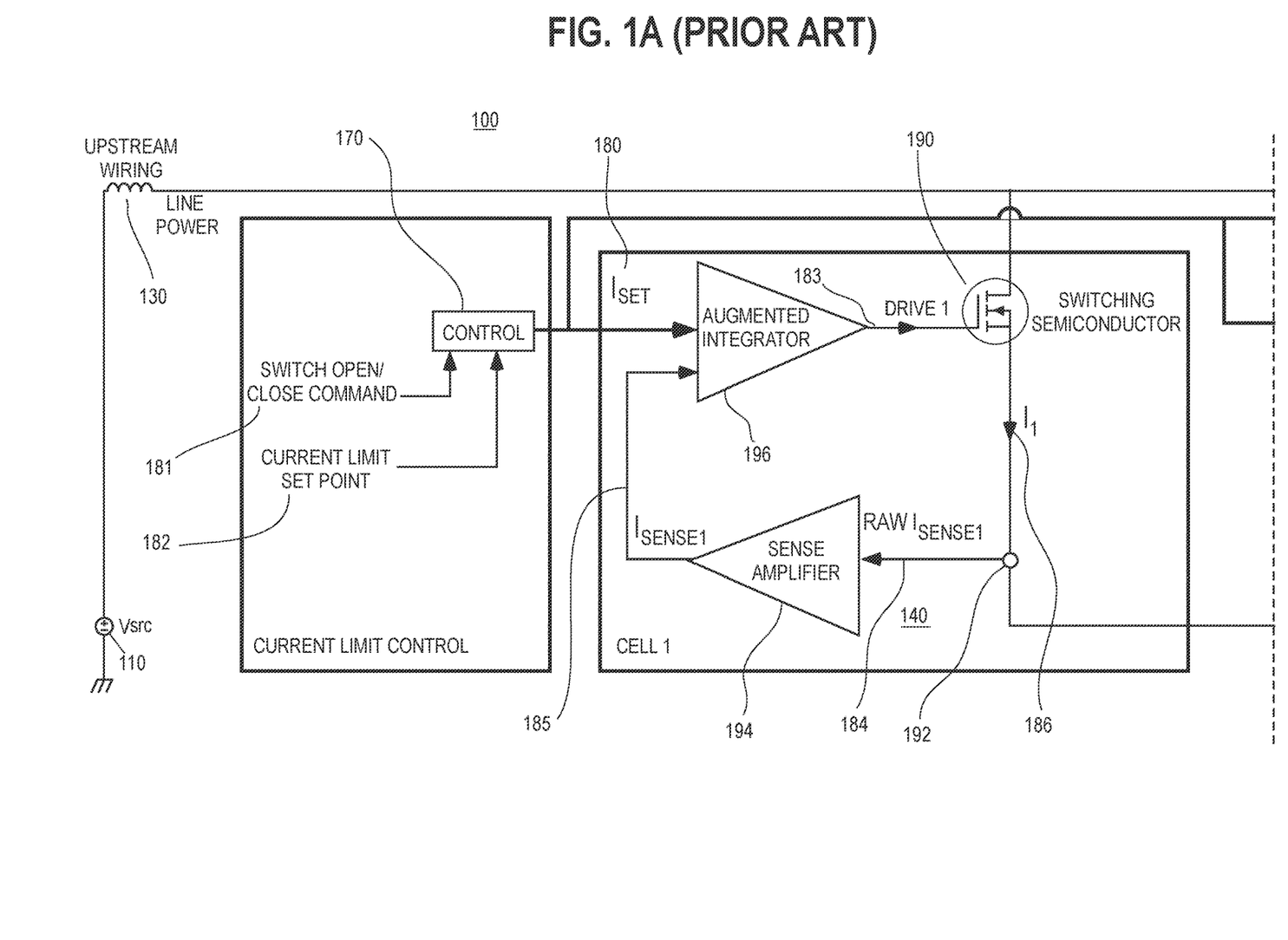
FIGS. 1A, 1B, and 1C illustrate a prior art multi-semiconductor SSPC.
Figure 1B:
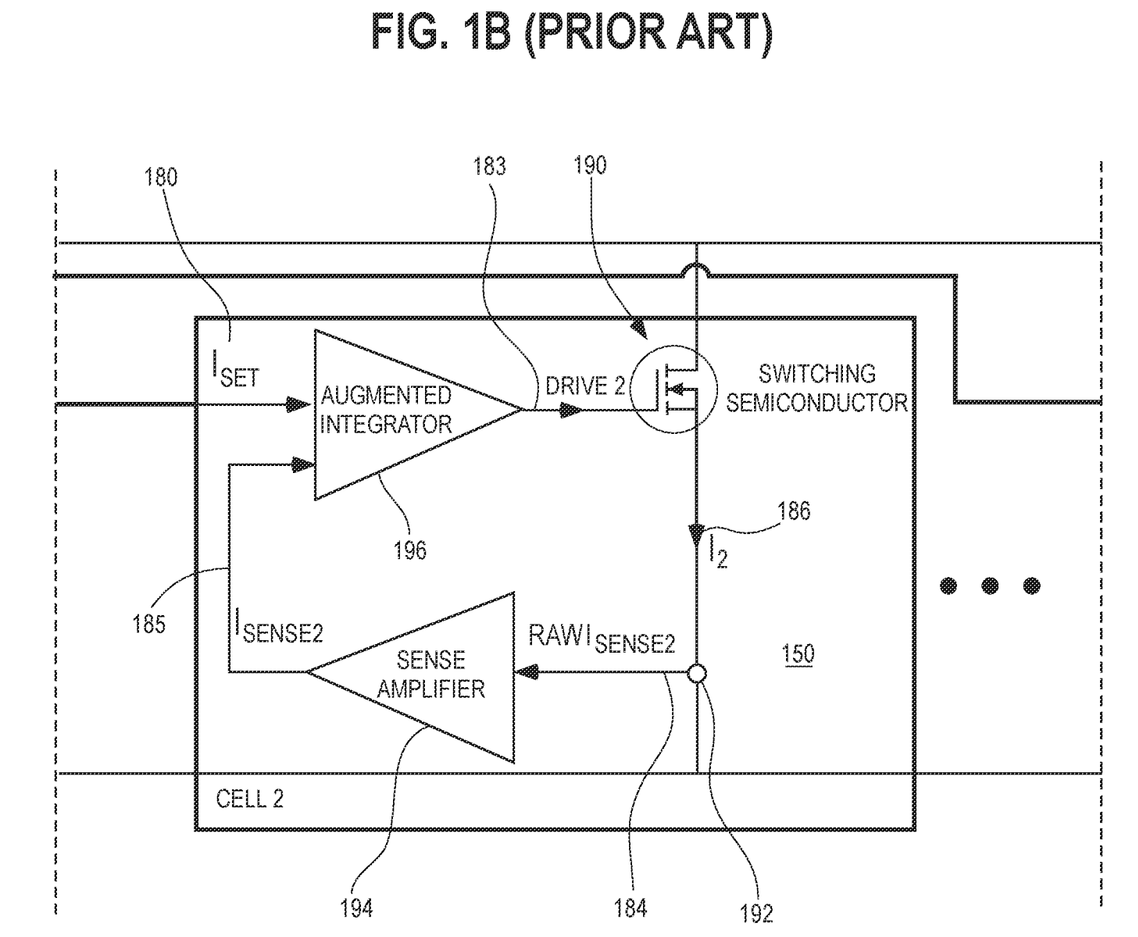
Figure 1C:
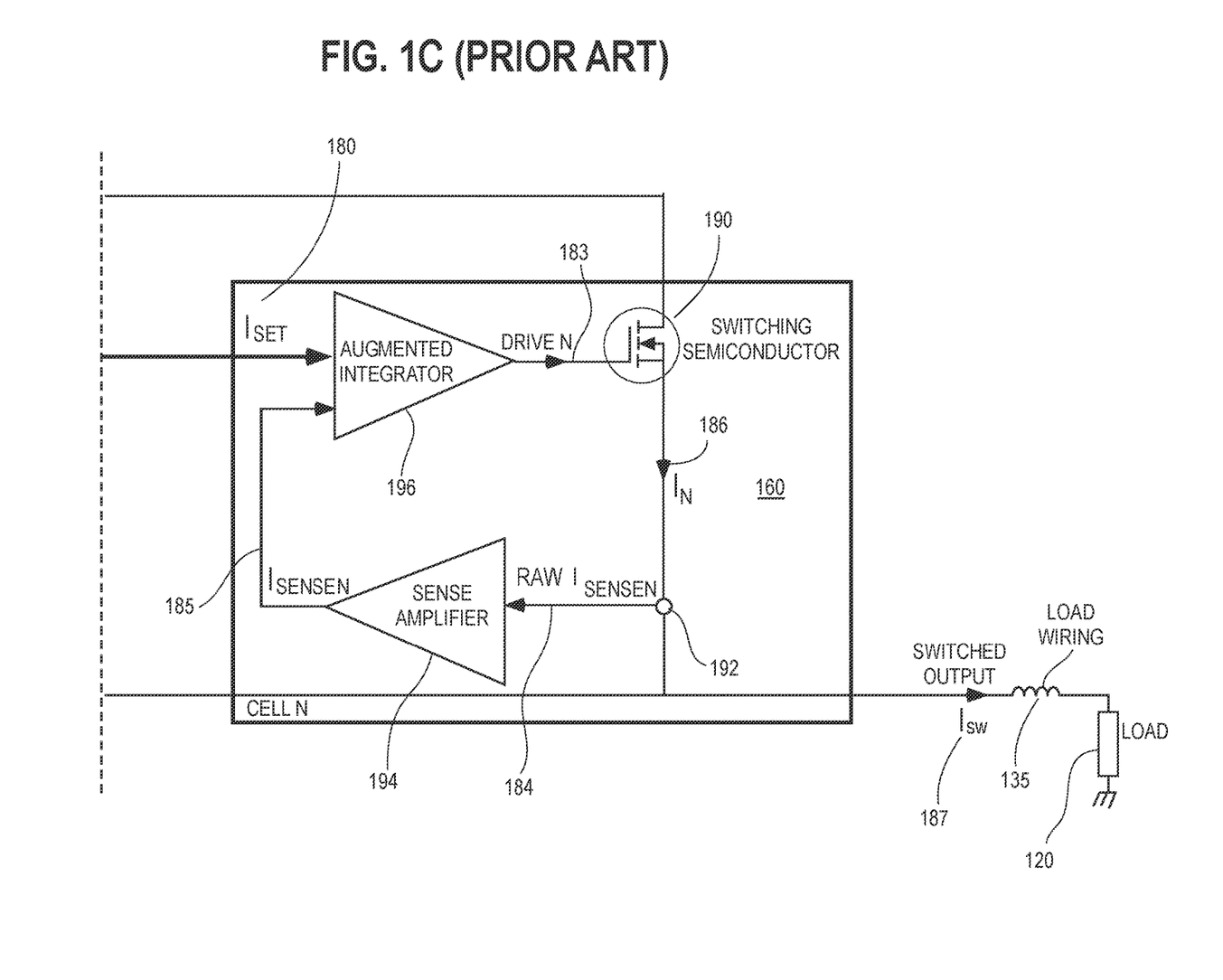

FIGS. 1A-C illustrate a prior art multi-semiconductor SSPC 100 installed in an application having the multi-semiconductor SSPC 100 installed between a voltage source 110 and a load 120. On the source side of the multi-semiconductor SSPC 100 there is upstream wiring 130 between the voltage source 110 and the multi-semiconductor SSPC 100. On the load side of the multi-semiconductor SSPC 100 there is load wiring 135 between the multi-semiconductor SSPC 100 and the load 120. The multi-semiconductor SSPC 100 may have N commonly controlled cells for passing current to a load and a current limit controller 170 commonly connected to each of the N cells. The multi-semiconductor SSPC 100 is illustrated as having three cells: current cell 140, shown in FIG. 1A, current cell 150, shown in FIG. 1B, and current cell 160, shown in FIG. 1C. The current cells 140, 150, and 160 are each commonly connected to the current limit controller 170, shown in FIG. 1A, and each receive an identical current setting signal 180.

The current setting signal 180 is generated by the current limit controller 170 based on the switch open/close command 181 and the current limit set point signal 182. The current limit set point signal 182 is determined as a percentage of the rated voltage of a switching semiconductor under control. When the switch open/close command 181 indicates that the switching semiconductors of the N cells of the multi-semiconductor SSPC 100 should be delivering current, the current limit set point signal 182 is passed to each of the cells, and when the switch open/close command 181 indicates that the switching semiconductors of the N cells of the multi-semiconductor SSPC 100 should not be supplying current, the current limit set point signal 182 is pulled to ground level.

Each of the current control cells 140, 150, and 160 achieves closed loop control that adjusts current that flows through them. The closed loop control can be accomplished through the use of a closed loop mechanism. In FIGS. 1A-C, each of the respective current control cells 140, 150, and 160 have a switching semiconductor 190 connected to a current level sensor 192 which is connected to a sense amplifier 194 which is connected to an augmented integrator 196, which is in turn connected to switching semiconductor 190 in a closed loop.

Closed loop control is achieved by adjusting the drive current 183 to the switching semiconductors 190 in each of the current cells 140, 150, and 160 based on the magnitude of a cell current 186 passing through the cell. To do this the cell current 186 is measured by the current level sensor 192. The raw sensed current signal 184 output from the current level sensor 192 is typically small and thus amplified using the sense amplifier 194 to generate the sensed current signal 185 which is then passed to the augmented integrators 196 for comparison to the value of the current setting signal 180. The total switched output current 187 is equal to the sum of each of the cell currents 186.

The drive current 183 output from each of the augmented integrators 196 is determined by the difference between the sensed current level signal 185 and the current setting signal 180. Each of the current cells 140, 150, and 160 control the drive current 183 passing through them independently based on the difference between the current setting signal 180 and the current level signal 185. Such a configuration allows the multi-semiconductor SSPC 100 to equalize the current being passed through each cell to minimize the power being dissipated across each of the switching semiconductors 190, regardless of the power characteristics, such as rated current or on resistance, of the switching semiconductors 190.

Other market solutions for current management in multi-semiconductor SSPCs have relied on a matched semiconductor approach but it is understood that those solutions produce multi-semiconductor SSPCs that have reliability issues, poor power quality, and short useful lives.

Elements in the figures are illustrated for simplicity and clarity and have not necessarily been drawn to scale. For example, the dimensions and/or relative positioning of some of the elements in the figures may be exaggerated relative to other elements to aid in understanding various embodiments. Also, common but well-understood elements that are useful or necessary in a commercially feasible embodiment are often not depicted to facilitate a less obstructed view of these various embodiments.

DETAILED DESCRIPTION

The solutions proposed by this disclosure solve bus level problems affecting systems implementing multiple multi-semiconductor SSPCs as well as controller level problems affecting individual SSPCs. These bus level and controller level problems adversely affect multi-semiconductor SSPCs and their associated systems. Multi-semiconductor SSPCs are frequently implemented in a variety of vehicle and craft control systems including those for automobiles, aircraft, spacecraft, and trains. However, the use of multi-semiconductor SSPCs is not so limited.

Bus level problems arise in multi-semiconductor SSPCs implemented in such control systems because the SSPCs close very quickly and can cause significant current and voltage transients to occur on their input buses. For example, in an aircraft power distribution system, the input bus is commonly connected to multiple loads via separate multi-semiconductor SSPCs, and these transients can cause erroneous behaviour that can affect multiple systems, such as unrequired battery fill-in and other undesirable behaviours. Currently, the loads connected to a bus need to be designed to tolerate worst-case positive and negative transients that occur during switching of the multi-semiconductor SSPCs. This design consideration can add complexity and cost to system designs. Because the multi-semiconductor SSPCs disclosed herein limit transients that occur on the bus, complexity and cost can be reduced.

Controller level problems also occur because of the significant current and voltage transients that occur during system operation. These transients cause a greater amount of power to dissipate across the switching semiconductors in a multi-semiconductor SSPC leading to reduced reliability and a shortened useful life for the multi-semiconductor SSPC.

In a controller with a single switching semiconductor, the gate of that switching semiconductor can be charged with a constant current to facilitate a controlled ramp-on. However, providing a controlled voltage ramp rate in multi-semiconductor SSPCs is not straight forward because the transfer characteristics of the switching semiconductors can vary wildly depending on, for example, batch number and the position of the die on the wafer. Using a common current source to drive parallel switching semiconductors will result in poor current sharing which will overstress certain devices during ramp-on. This disclosure provides a closed-loop ramp rate control mechanism to ensure that current sharing is maintained during start-up, making controlled ramp-on viable.

Both the bus level and controller level problems can be resolved by implementing controlled rate-change of voltage (dv/dt) ramp-on rate, as discussed below, to ensure that the voltage on the input bus does not collapse when an SSPC is commanded closed and that a minimum amount of power is being dissipated across the switching semiconductors. A voltage on the input bus is said to collapse when it falls below a level which is sufficient to meet the needs of the devices powered by the bus.

Figure 2:
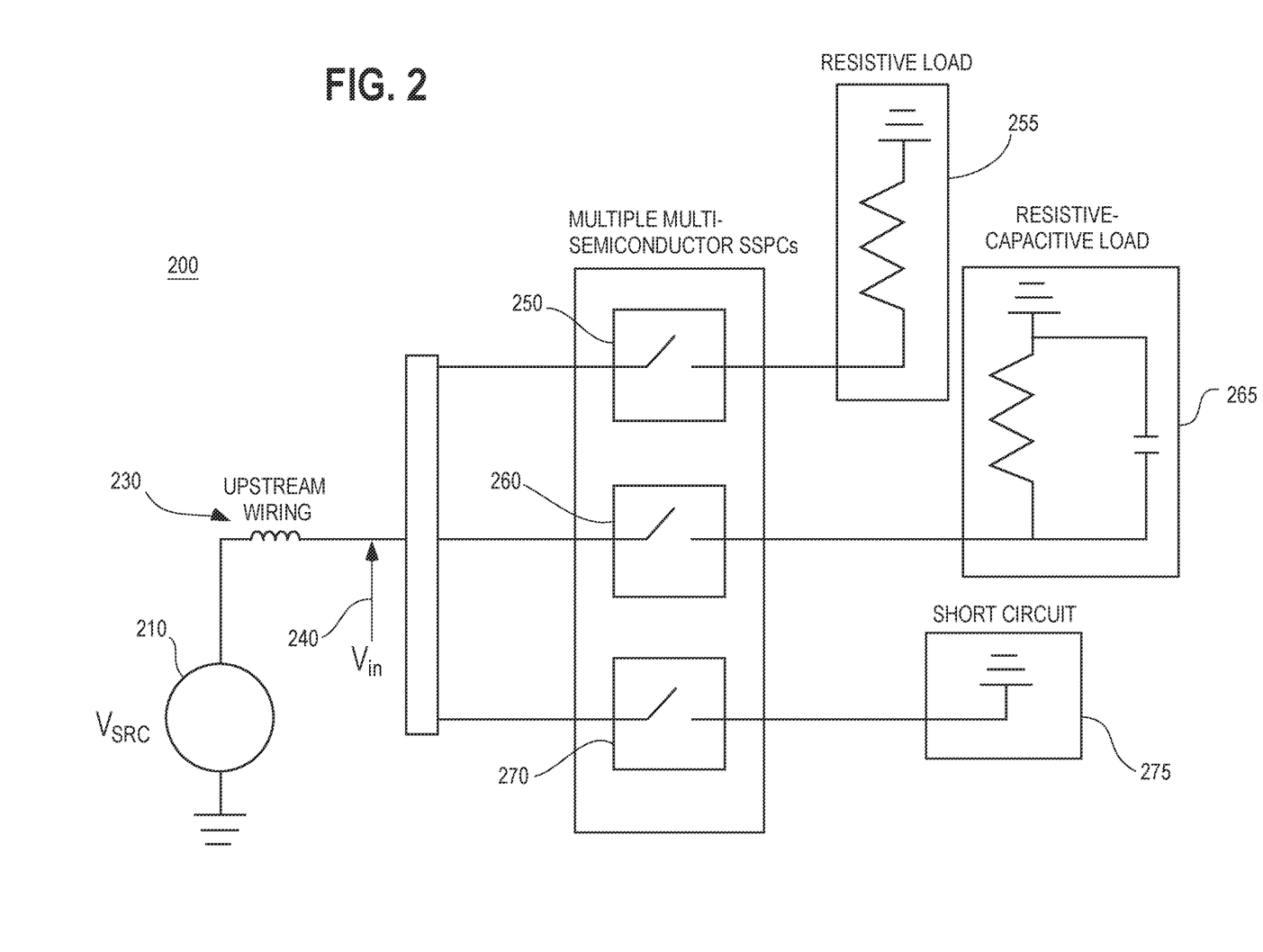
FIG. 2 illustrates a system implementing plural multi-semiconductor SSPCs in accordance with the SSPCs described in the detailed disclosure.

FIG. 2 illustrates a system 200 implementing multiple multi-semiconductor SSPCs and sharing a common input bus. The system 200 includes a voltage source 210 commonly connected to multi-semiconductor SSPCs 250, 260, and 270 via upstream wiring 230. The multi-semiconductor SSPC 250 is connected to a resistive load 255, the multi-semiconductor SSPC 260 is connected to a resistive-capacitive load 265, and the multi-semiconductor SSPC 270 has a load or short circuit 275 that is shorted to ground.

FIGS. 3A-D illustrate a multi-semiconductor SSPC 300, according to the present disclosure, installed or implemented in an application having the multi-semiconductor SSPC 300 installed between a voltage source 310 and a load 320. On the source side of the multi-semiconductor SSPC 300 there is upstream wiring 330 between the voltage source 310 and the multi-semiconductor SSPC 300. For example, the multi-semiconductor SSPC 300 may be used in the system 200 as any of the multi-semiconductor SSPCs 250, 260, or 270. On the load side of the multi-semiconductor SSPC 300 there is load wiring 335 between the multi-semiconductor SSPC 300 and the load 320. The multi-semiconductor SSPC 300 may have N commonly controlled cells for passing current to a load and a current limit controller 371 commonly connected to each of the N cells. The multi-semiconductor SSPC 300 is illustrated as having three cells: current cell 340, shown in FIG. 3B, current cell 350, shown in FIG. 3C, and current cell 360, shown in FIG. 3D. The current cells 340, 350, and 360 are each commonly connected to the current limit controller 371, shown in FIG. 3A, and each receive a roughly identical current setting signal 380.

Figure 3A:
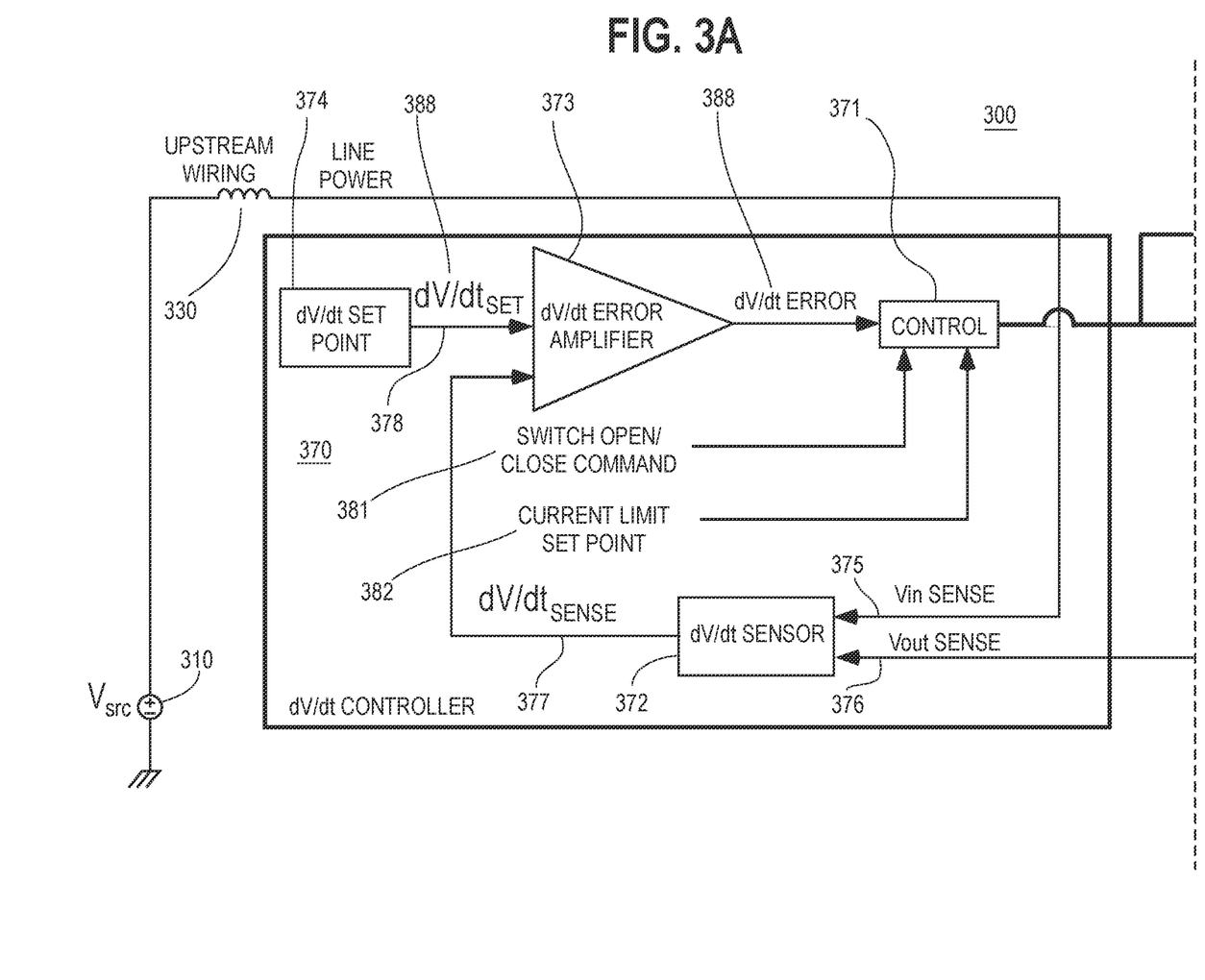
FIGS. 3A, 3B, 3C, and 3D illustrate an example of a multi-semiconductor SSPC according to the detailed disclosure.

The current setting signal 380 is generated by the current limit controller 371 based on the switch open/close command 381, the current limit set point signal 382, and the dv/dt error signal 388. The current limit set point signal 382 is determined as a percentage of the rated voltage of a switching semiconductor under control. When the switch open/close command 381 indicates that the switching semiconductors of the N cells of the multi-semiconductor SSPC should be delivering current, the current limit set point signal 382 is passed to each of the cells, and when the switch open/close command 381 indicates that the switching semiconductors of the N cells of the multi-semiconductor SSPC should not be supplying current, the current limit set point signal 382 is pulled to ground level.

Figure 3B:
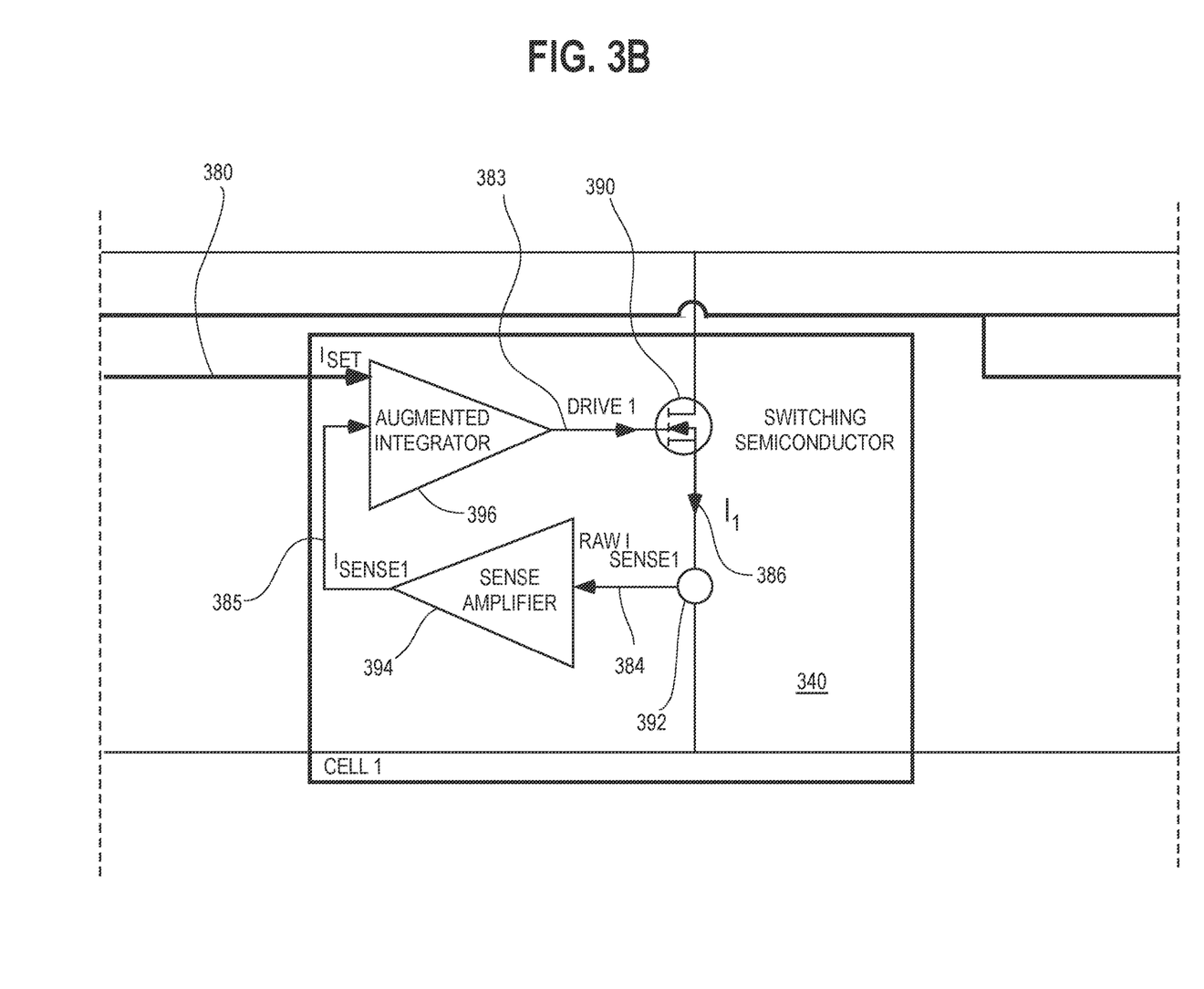
Figure 3C:
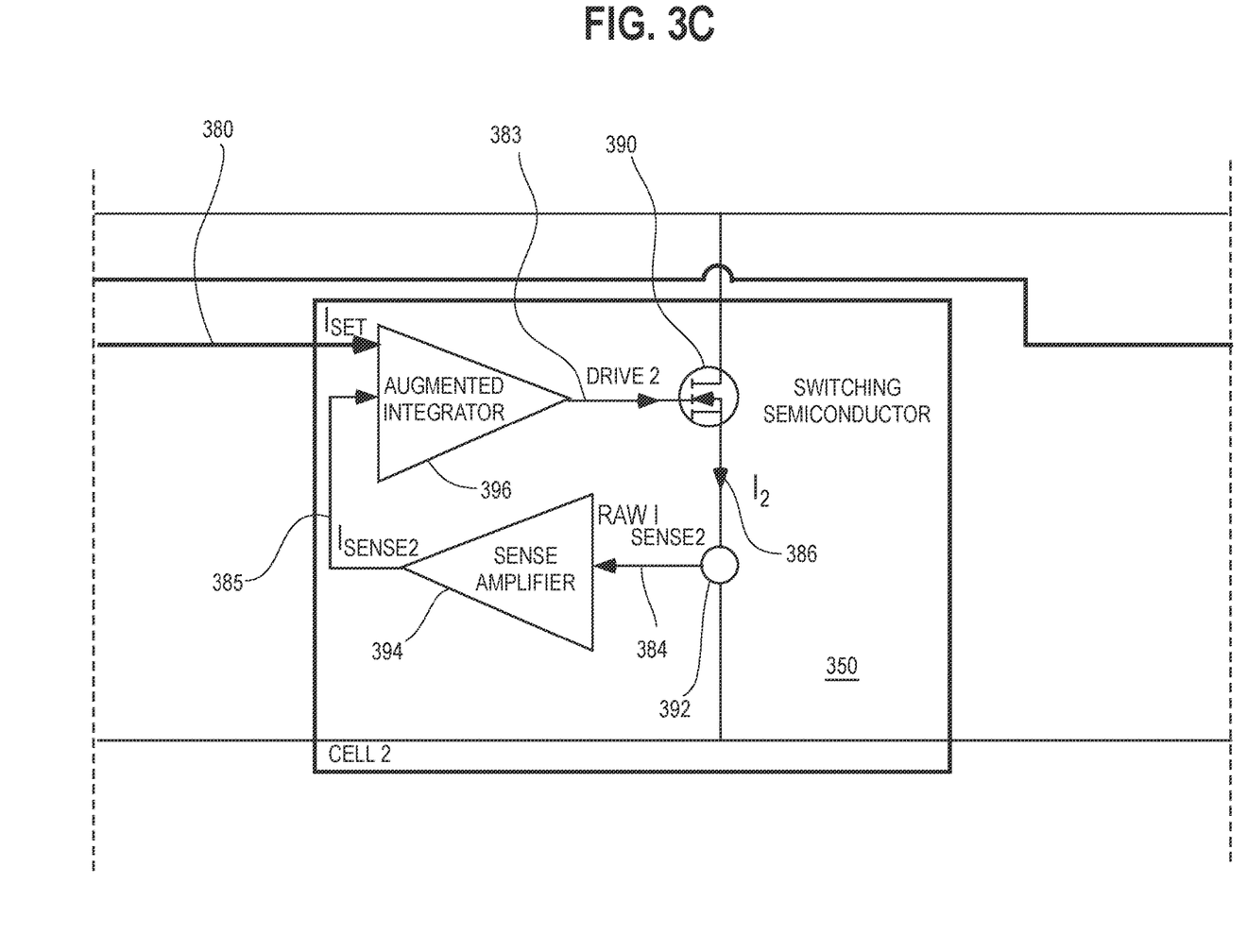
Figure 3D:
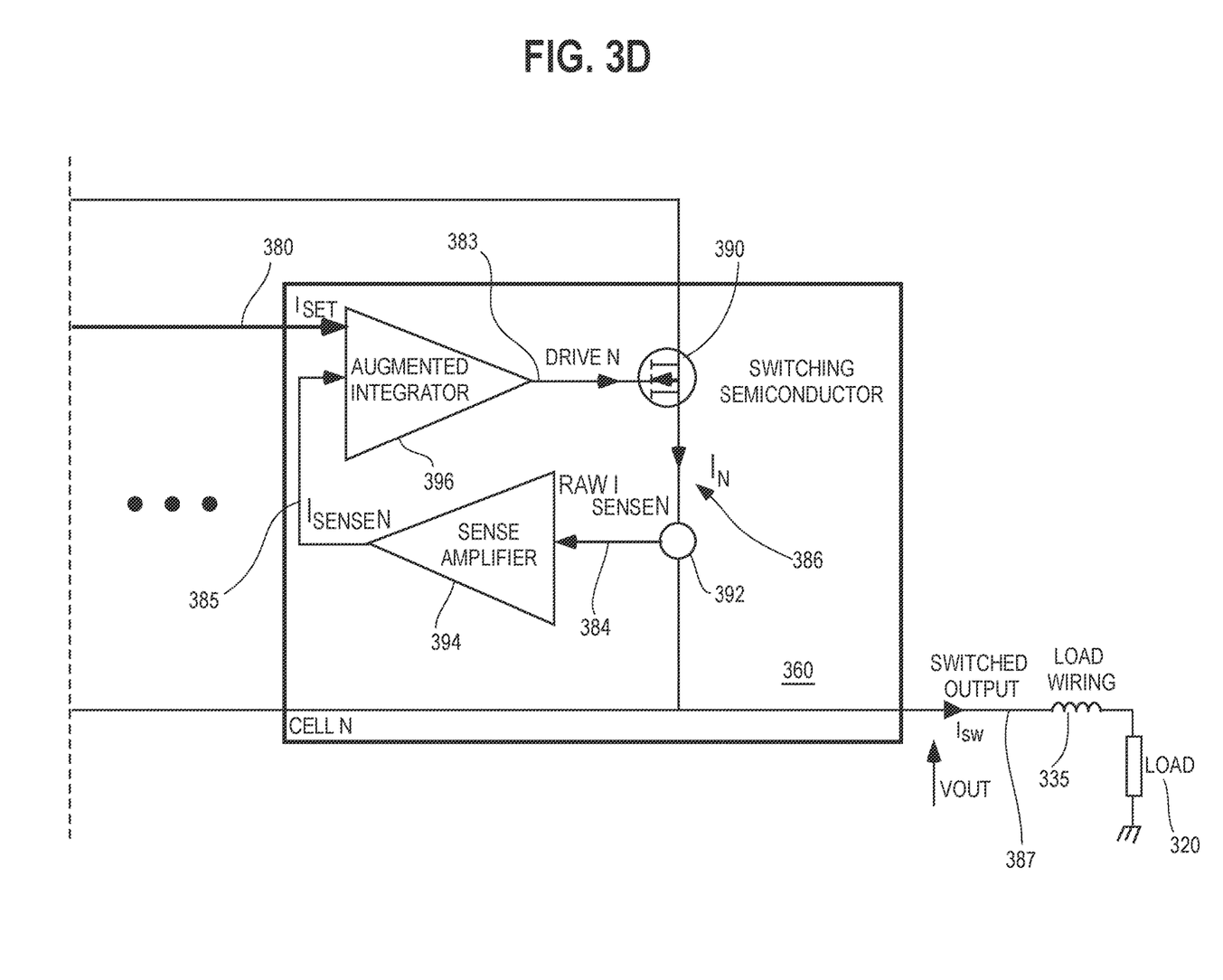

Each of the current control cells 340, 350, and 360 achieves closed loop control that adjusts current that flows through them. The closed loop control can be accomplished through the use of a closed loop mechanism. In FIGS. 3B-D, each of their respective current control cells 340, 350, and 360 have a switching semiconductor 390 connected to a current level sensor 392 which is connected to a sense amplifier 394 which is connected to an augmented integrator 396, which is in turn connected to switching semiconductor 390 in a closed loop.

A first level of closed loop current control is achieved within each of the current control cells 340, 350, and 360 by adjusting the drive current 383 to the switching semiconductors 390 in each of the current cells 340, 350, and 360 based on the magnitude of a cell current 386 passing through the cell. To do this the cell current 386 is measured by the current level sensor 392. The raw sensed current signal 384 output from the current? level sensor 392 is typically small and thus amplified using the sense amplifier 394 to generate the sensed current signal 385 which is then passed to the augmented integrators 396 for comparison to the value of the current setting signal 380. The total current output to the load 387 is equal to the sum of each of the cell currents 386.

The drive current 383 output from each of the augmented integrators 396 is determined by the difference between the sensed current level signal 385 and the current setting signal 380. Each of the current cells 340, 350, and 360 control the current 383 passing through them independently based on the difference between the current setting signal 380 and the current level signal 385. Such a configuration allows the multi-signal SSPC 300 to equalize the current being passed through each cell to minimize the power being dissipated across each of the switching semiconductors 390, regardless of the power characteristics, such as rated current or on resistance, of the switching semiconductors 390.

A second level of closed loop control is implemented in the multi-semiconductor SSPC 300 to control slew rate of the output voltage of the multi-semiconductor SSPC 300. As noted above with prior art devices, large voltage transients can occur across loads sharing a common voltage source over a bus. In the context of system 200, a large resistive load such as resistive load 255, could cause the input voltage 240 to drop sharply during ramp-on causing undesired system effects. Likewise, the capacitor of a resistive-capacitive load may cause a sharp drop in the input voltage 240 during ramp-on because the capacitor acts like a short circuit until charge is built up within the capacitor. If a SSPC connects to a short circuit, such as the short circuit 275, during ramp-on, or otherwise, prior art SSPCs might allow the input voltage 240 to collapse. The multi-semiconductor SSPC 300 implements a second level of closed loop control on the prior art implementation described with respect to prior art FIGS. 1A-C which preserves the benefits of the multi-semiconductor SSPC 100 while preventing large changes in output voltage across the load 320 thus preventing large adverse changes in the input voltage 240.

To achieve such a second level closed loop control, a dv/dt controller 370 is implemented. The dv/dt controller 370 has a dv/dt sensor 372 connected in parallel to each of the current cells 340, 350, and 360, as shown in FIGS. 3B-D, and a dv/dt error amplifier 373, shown in FIG. 3A. The dv/dt error amplifier 373 is in turn connected to a dv/dt set point module 374 and the current limit controller 371.

The dv/dt sensor 372 is connected to appropriate nodes for measuring the input voltage, $V_{in}$ sense, 375 and output voltage, $V_{out}$ sense, 376 of the multi-semiconductor SSPC 300. The output voltage is the voltage across the load 320. The dv/dt sensor 372 outputs the $dv/dt_{sense}$ signal 377 which represents the rate change of the output voltage 376 compared to the input voltage 375. The dv/dt sensor 372 may be implemented by, for example, an RC differentiator circuit connected between the input voltage 375 and the output voltage 376. The specific electrical positioning of the dv/dt sensor 372 may depend on the semiconductors being driven in the multi-semiconductor SSPC 300 and the specific electrical configuration of the multi-semiconductor SSPC 300. For example, voltage signals other than the input voltage 375 or the output voltage 376 may be referenced to determine the rate change of voltage relevant to a particular application.

A dv/dt error amplifier 373 receives the $dv/dt_{sense}$ signal 377 and a $dv/dt_{set}$ signal 378. The $dv/dt_{set}$ signal 378 is generated by a dv/dt set point module 374. The dv/dt error amplifier 373 determines the difference between the $dv/dt_{sense}$ signal 377 and the $dv/dt_{set}$ signal 378. The dv/dt error amplifier 373 outputs a dv/dt error signal 388 that represents the difference between the $dv/dt_{sense}$ signal 377 and the $dv/dt_{set}$ signal 378.

The current limit controller 371 receives the dv/dt error signal 388, the switch open/close command 381, and the current limit set point signal 382 and outputs the current setting signal 380. The current limit controller 371 determines the current setting signal 380 for the multi-semiconductor SSPC 300. The current setting signal 380 will allow zero current when the current limit controller 371 is commanded open by switch open/close command 381. When switch open/close command 381 commands the current limit controller 371 closed, the current will not exceed the current limit set point signal 382. When the current limit controller 371 is initially commanded closed by the switch open/close command 381 the current setting signal 380 will allow any value, as determined based on the dv/dt error signal 388, between zero and the current value indicated by the current limit set point signal 382. However, at a predetermined time after the current limit controller 371 is initially commanded closed, the current setting signal 380 will become fixed to the value of the current limit set point signal 382 to avoid dv/dt spurious events during normal operation that cause erroneous behavior.

Figure 4A:
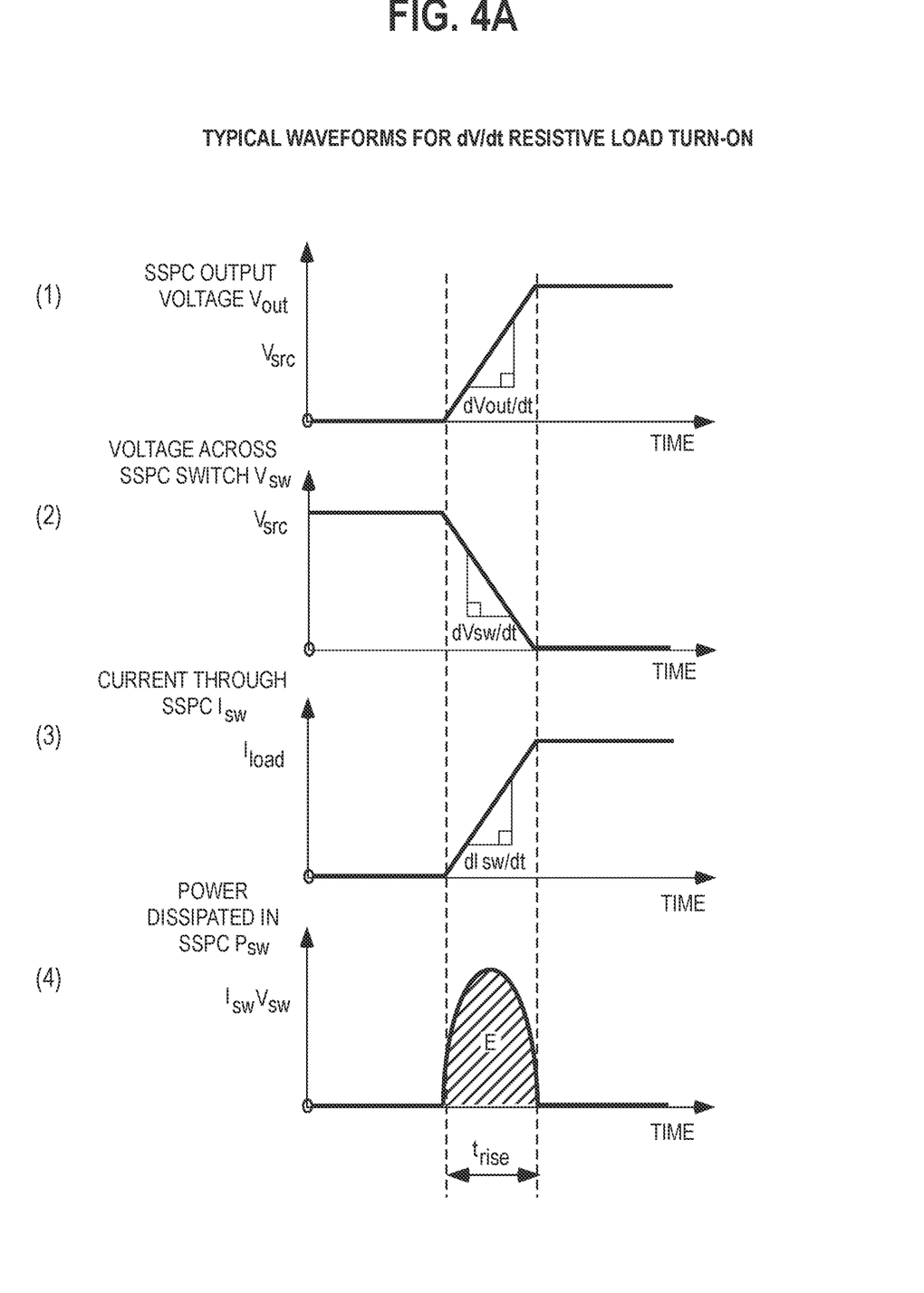
FIGS. 4A, 4B, and 4C illustrate various power characteristics of an SSPC according to the detailed disclosure.
Figure 4B:
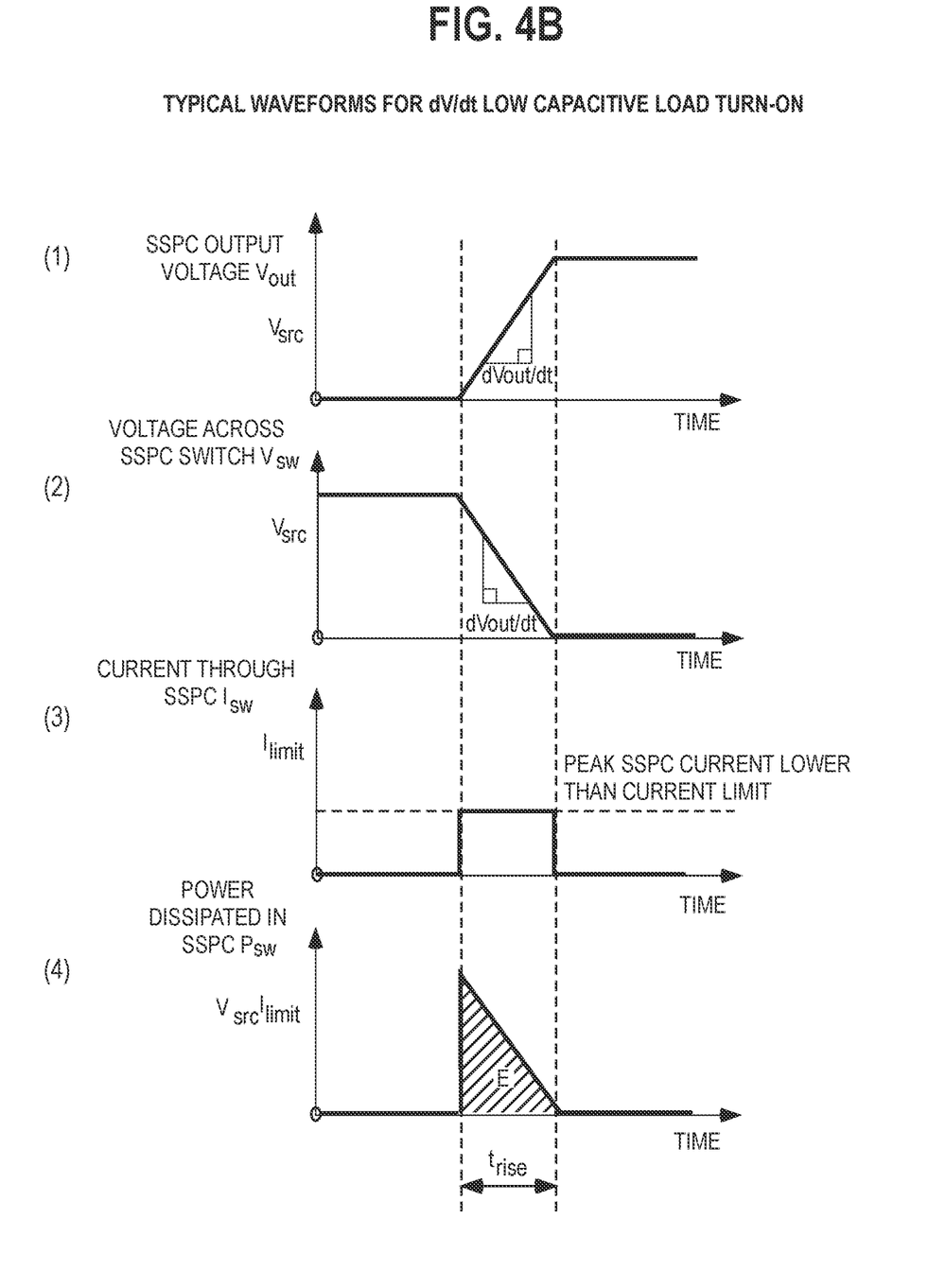
Figure 4C:
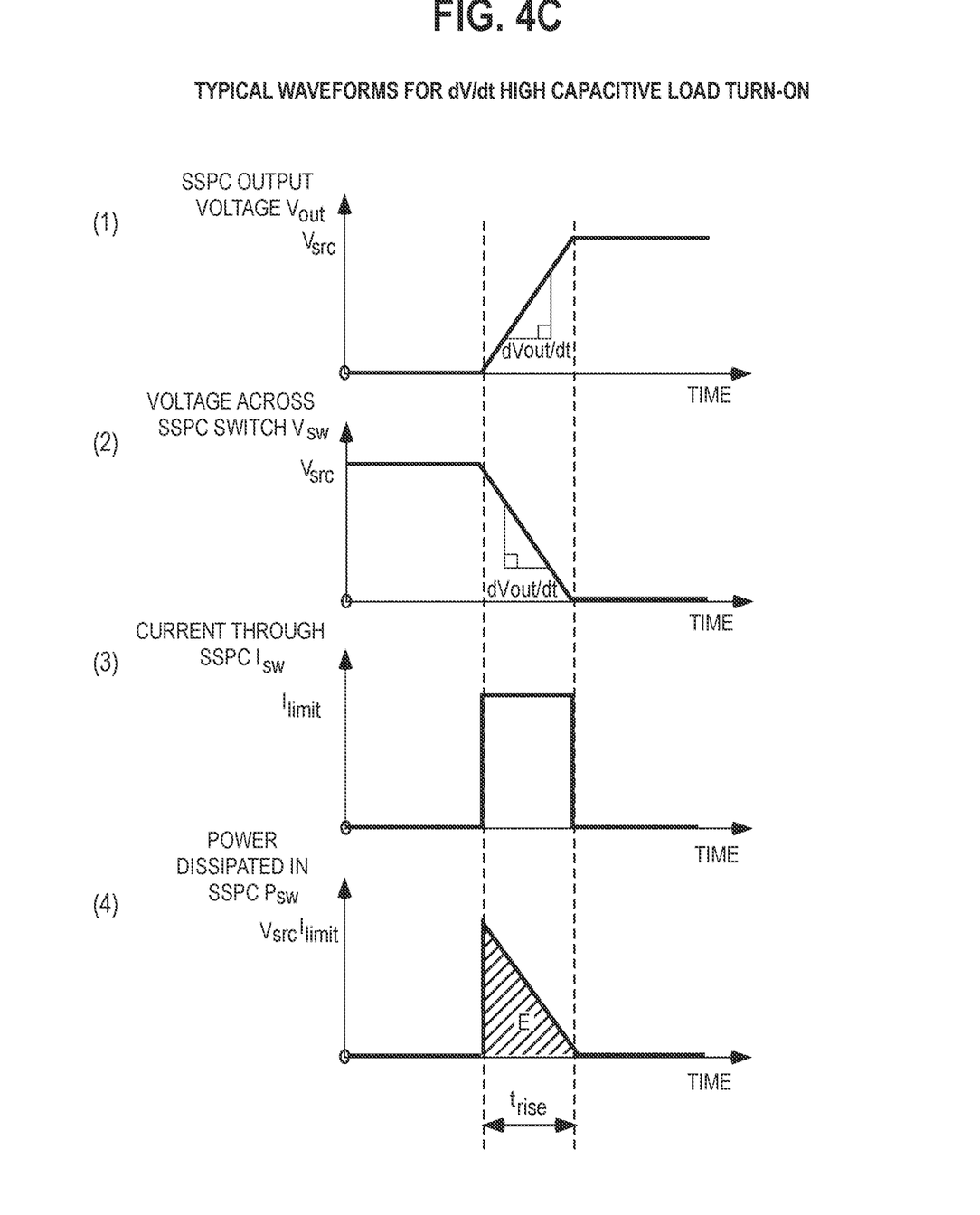

FIGS. 4A-C represent a set of typical waveforms for a multi-semiconductor SSPC under different load conditions. FIGS. 4A-C are to be interpreted as being generic to the multi-semiconductor SSPCs of FIGS. 1A-C and 3A-D. The multi-semiconductor SSPC 300 disclosed herein beneficially modifies the rise time, $t_{rise}$, and peak power characteristics by limiting and/or controlling the slew rate or rate change of voltage across a load of an SSPC. Two primary benefits result from implementing the multi-semiconductor SSPC 300. First, large input voltage drops are prevented because the rate-change of voltage control in multi-semiconductor SSPC 300 prevents large increases in the output voltage across the load. Preventing large decreases in input voltage avoids many unwanted system behaviors. Second, because the increase in output voltage is being controlled by limiting the amount of available current, the peak power dissipated across the switching semiconductors 390 of the multi-semiconductor SSPC 300 is lowered. Lowering the peak power dissipated across the switching semiconductors of a multi-semiconductor SSPC 300 as disclosed herein increases power quality, extends useful life, and increases reliability of multi-semiconductor SSPCs such as the multi-semiconductor SSPC 300 disclosed herein. Each of FIGS. 4A-C is described below.

FIG. 4A illustrates electrical characteristics for a multi-semiconductor SSPC having a resistive load at turn on. Graph 4a(1) illustrates the output voltage of a multi-semiconductor SSPC as a function of the input voltage and time. As illustrated, the output voltage changes linearly over time. Correspondingly, the voltage across a switching semiconductor, such as switching semiconductor 390, decreases linearly with respect to time as illustrated in graph 4a(2) and the current increases linearly across the switching semiconductor as illustrated in graph 4a(3). Because a voltage across a purely resistive load can change from one level to another level, more or less instantaneously, the multi-semiconductor SSPC 100 potentially allows a larger peak power to be dissipated across the switching semiconductor than would be dissipated across a switching semiconductor of the multi-semiconductor SSPC 300 where $t_{rise}$ is lengthened to lower the peak power dissipation. In other words, the curve illustrating the power, $P_{sw}$, illustrated in graph 4a(4), dissipated across the switching semiconductor flattens as $t_{rise}$ lengthens. The closed-loop control of the multi-semiconductor SSPC 300 works to ensure that the total energy dissipated, E, is evenly dissipated across each of the switching semiconductors 390 in multi-semiconductor SSPC 300.

FIGS. 4B and 4C illustrate electrical characteristics for a multi-semiconductor SSPC having a capacitive load at turn on. FIG. 4B illustrates electrical characteristics for a multi-semiconductor SSPC having a low capacitive load at turn on. FIG. 4C illustrates electrical characteristics for a multi-semiconductor SSPC having a high capacitive load at turn on. Like graph 4a(1), in graphs 4b(1) and 4c(1) the output voltage changes linearly over time. And like graph 4a(2), in graphs 4b(2) and 4c(2) the voltage across a switching semiconductor, such as switching semiconductor 390, decreases linearly with respect to time. However, because a capacitive load has characteristics of a short circuit until the capacitor is fully charged, capacitive loads can demand a large current which will not only cause large drops in the input voltage but also cause larger amounts of power to be dissipated across the switching semiconductor. In the multi-semiconductor SSPC 100 the amount of current demanded by a capacitive load is a function of the capacitance of the load and the amount of current that can be supplied to the load, limited by the closed-loop current control according to a current limit set point value. As illustrated in graph 4b(c) a load having a load capacitance might demand a current lower than a set current limit. However, a load having a high capacitance might demand a current that hits the current limit as illustrated in graph 4c(3). Typically, current limits for an SSPC might be set to 600 percent of the rated current for its switching semiconductors to accommodate various load conditions. However, allowing for such currents may cause undesirable drops in input voltage and allow for high peak power dissipation values across the switching semiconductors. The multi-semiconductor SSPC 300 allows the control and/or limiting of current delivered to a capacitive load to avoid undesirable drops in input voltage and to avoid large peak powers being dissipated across the switching semiconductors by extending $t_{rise}$. Like the curve illustrating the power, $P_{sw}$, illustrated in graph 4a(4), the curve illustrating the power, $P_{sw}$, illustrated in graphs 4b(4) and 4c(4), flattens as $t_{rise}$ lengthens. In other words, it is as if the multi-semiconductor SSPC 300 is charging a capacitor that has a lower capacitance for a longer period of time.

FIGS. 4A-C have been idealized for ease of explanation. One of ordinary skill in the art would recognize that waveforms of a physical device operating according to this disclosure would exhibit electrical characteristics that depart from the idealized case illustrated in FIGS. 4A-C.

Figure 5:
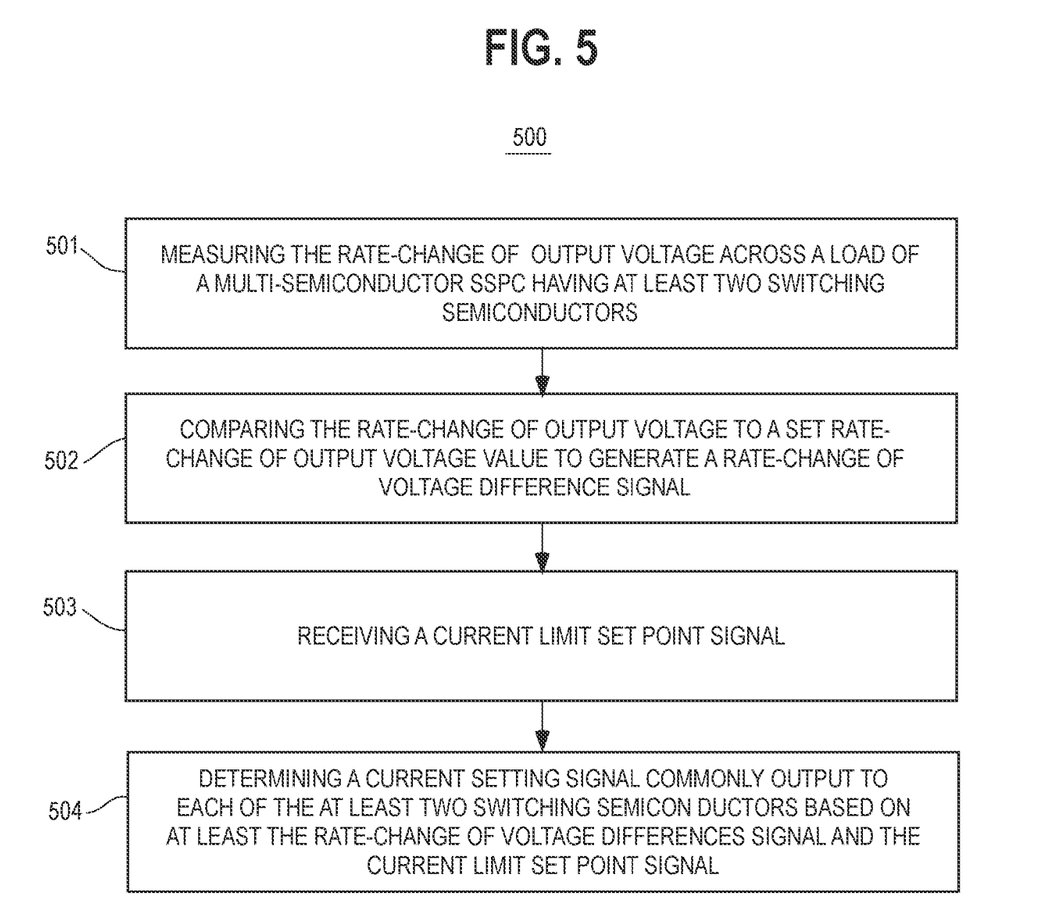
FIG. 5 is a flow chart of a method for implementing dv/dt control in an SSPC controller.

FIG. 5 illustrates a flow chart of a method 500 for implementing dv/dt control in a multi-semiconductor SSPC. At step 501, the rate-change of output voltage across the load of a multi-semiconductor SSPC having at least two switching semiconductors is measured. At step 502, the rate-change of output voltage is compared to a set rate-change of output voltage value to generate a rate-change of voltage error signal. At step 503, a current limit set point signal is received. And, at step 504, a current setting signal is commonly output to each of the at least two switching semiconductors, based on at least the rate-change of voltage error signal and the current limit set point signal, is determined.

At step 501 the voltage across the load may be accurately measured regardless of the number of switching semiconductors comprising an SSPC. Step 501 is implemented by a dv/dt sensor, such as dv/dt sensor 372, placed in parallel with each of the switching semiconductors of a multi-semiconductor SSPC and the load as illustrated, for example, in FIGS. 3A-D and described above. The rate change of voltage is determined by comparing the input voltage of an SSPC to the output voltage of the SSPC and outputting a voltage level that reflects the difference between the input voltage and the output voltage. The dv/dt sensor determines changes in voltage level by using, for example, capacitive coupling methods.

At step 502 the rate-change of output voltage is compared to a set rate-change of output voltage value to generate a dv/dt error signal used to determine the value of the current setting signal 380 as illustrated in FIGS. 3A-D and described above. A dv/dt error amplifier, such as dv/dt error amplifier 373, compares the sensed rate of change of the load voltage to a set point value for the rate change of voltage. The dv/dt error amplifier operates as a differential amplifier that amplifies the difference between the set point value and the sensed rate of the change of the load voltage. The dv/dt error amplifier may be implemented as, for example, a long-tailed pair, an operational amplifier or an instrumentation amplifier.

At step 503, a current limit set point signal, such as current limit set point signal 382, is received. In one embodiment, the current limit set point signal is a fixed value determined based on the power characteristics of the switching semiconductors that comprise a multi-semiconductor SSPC. In other embodiments, the current limit set point signal can be adjusted before, after, or during operation of a multi-semiconductor SSPC to optimize performance of the multi-semiconductor SSPC.

At step 504, a current setting signal such as current setting signal 380, is determined by a controller, such as current limit controller 371, as illustrated and described with respect to FIGS. 3A-D. The controller receives the difference between the measured rate of change of the load voltage and the dv/dt set point value as an amplified error signal, receives a switch open/close command, such as switch open/close command 381, and receives the current limit set point signal. Based on these signals, a current setting signal is commonly output to each of the switching semiconductors in a multi-semiconductor SSPC.

When the switch open/close command indicates that the switching semiconductors of the N cells of the multi-semiconductor SSPC should be delivering current, the current limit set point signal is passed to each of the cells, and when the switch open/close command indicates that the switching semiconductors of the N cells of the multi-semiconductor SSPC should not be supplying current, the current limit set point signal 382 is pulled to ground level.

Thus, when the switch open/close command indicates that the cells of the multi-semiconductor SSPC should be delivering current to the load, the control determines the value of the current setting signal based on the dv/dt error signal and the current limit set point value. The control determines the value of the current setting signal dynamically according to the rate-change of voltage across the multi-semiconductor SSPC. After the level of the output voltage of the multi-semiconductor SSPC has reached the level of the input voltage, the current demand to each switching semiconductor in the multi-semiconductor SSPC conforms to the level required by the current limit set point.

1. A method for slew rate control of a multi-semiconductor solid state power controller (SSPC) (300), the method comprising: measuring, by at least one sensor, a rate-change of output voltage (377) across a load (320) of a multi-semiconductor SSPC (300) having at least two switching semiconductors (390); comparing, by at least one amplifier, the rate-change of output voltage (377) to a set rate-change of output voltage value (378) to generate a rate-change of voltage error signal (388); receiving, by at least one controller, a current limit set point signal (382); and determining a current setting signal (380), based on at least the rate-change of voltage error signal (388) and the current limit set point signal (382).

2. The method of any preceding clause, wherein the step of measuring further comprises: receiving an input voltage signal (375) of the multi-semiconductor SSPC (300); receiving an output voltage signal (376) representing a voltage across the load (320) of the multi-semiconductor SSPC (300); and measuring the rate-change of output voltage (377) across the load (320) of a multi-semiconductor SSPC (300) based on the input voltage signal (375) and the output voltage signal (376).

3. The method of any preceding clause further comprising commonly outputting the current setting signal (380) to each of the at least two switching semiconductors (390).

4. The method of any preceding clause further comprising controlling the rate-change of output voltage (377) based on a value of the determined current setting signal (380).

5. The method of any preceding clause wherein the step of comparing further comprises amplifying the difference between the rate-change of output voltage (377) and the set rate-change of output voltage value (378) to generate the rate-change of voltage error signal (388).

6. The method of any preceding clause wherein the current limit set point signal (382) is a fixed value during operation of the multi-semiconductor SSPC (300).

7. The method of any preceding clause wherein the current limit set point signal (382) can be adjusted during operation of the multi-semiconductor SSPC (300).

8. The method of any preceding clause further comprising receiving a switch open/close command (381), wherein the step of determining the current setting signal (380) based on a value of the switch open/close command (381).

9. An apparatus for slew rate control of a multi-semiconductor solid state power controller (SSPC) (300), the apparatus comprising: a dv/dt sensor (372) configured to measure a rate-change of output voltage (377) across a load (320) of a multi-semiconductor SSPC (300) having at least two switching semiconductors (390); a dv/dt error amplifier (373) configured to compare the rate-change of output voltage (377) to a set rate-change of output voltage value (378) to generate a rate-change of voltage error signal (388); a current limit controller (371) configured to receive a current limit set point signal (382) and configured to determine a current setting signal (380 based on at least the rate-change of voltage error signal (388) and the current limit set point signal (382).

10. The apparatus of any preceding clause wherein the dv/dt sensor (372) further comprises: a first input configured to receive an input voltage signal (375) of the multi-semiconductor SSPC (300); and a second input configured to receive an output voltage signal (376) representing a voltage across the load (320) of the multi-semiconductor SSPC (300), wherein the dv/dt sensor (372) is further configured to measure the rate-change of output voltage (377) across the load (320) of a multi-semiconductor SSPC (300) based on the input voltage signal (375) and the output voltage signal (376).

11. The apparatus of any preceding clause wherein the apparatus is configured to control the rate-change of output voltage (377) based on a value of the determined current setting signal (380).

12. The apparatus of any preceding clause wherein the dv/dt error amplifier (373) is further configured to amplify the difference between the rate-change of output voltage (377) and the set rate-change of output voltage value (378) to generate the rate-change of voltage error signal (388).

13. The apparatus of any preceding clause wherein the current limit set point signal (380) is a fixed value during operation of the multi-semiconductor SSPC (300).

14. The apparatus of any preceding clause wherein the current limit set point signal (380) can be adjusted during operation of the multi-semiconductor SSPC (300).

15. The apparatus of any preceding clause wherein the current limit controller (371) is further configured to receive a switch open/close command (381) and to determine the current setting signal (380) based on a value of the switch open/close command (381).

The embodiments of the systems, apparatuses and methods herein may also include or utilize one or more processors or devices that may be integrated with or provided separately from the SSPC (300). Such processors may be used to assist with or perform all or a portion of one or more functions or steps, including but not limited to measuring, comparing and determining, the various rate-changes, voltages, currents or signals described with respect to the above referenced embodiments, as would be understood by one of ordinary skill in the art.

It will be understood that various changes in the details, materials, and arrangements of parts and components which have been herein described and illustrated to explain the nature of an SSPC having slew rate control may be made by those skilled in the art within the principle and scope of the appended claims. Furthermore, while various features have been described with regard to particular embodiments, it will be appreciated that features described for one embodiment also may be incorporated with the other described embodiments.

What is claimed is:

1. A method for slew rate control of a multi-semiconductor solid state power controller (SSPC), the method comprising:
   measuring, by at least one sensor, a rate-change of output voltage across a load of the multi-semiconductor SSPC having at least two switching semiconductors connected, and operable, in parallel;
   comparing, by at least one amplifier, the rate-change of output voltage to a set rate-change of output voltage value to generate a rate-change of voltage error signal;
   receiving, by at least one controller, a current limit set point signal; and
   determining a current setting signal based on at least the rate-change of voltage error signal and the current limit set point signal.

2. The method of claim 1, wherein the step of measuring further comprises:
   receiving an input voltage signal of the multi-semiconductor SSPC;
   receiving an output voltage signal representing a voltage across the load of the multi-semiconductor SSPC; and
   measuring, the rate-change of output voltage across the load of the multi-semiconductor SSPC based on the input voltage signal and the output voltage signal.

3. The method of claim 1, further comprising: commonly outputting the current setting signal to each of the at least two switching semiconductors.

4. The method of claim 1, further comprising: controlling the rate-change of output voltage based on a value of the determined current setting signal.

5. The method of claim 1, wherein the step of comparing further comprises amplifying a difference between the rate-change of output voltage and the set rate-change of output voltage value to generate the rate-change of voltage error signal.

6. The method of claim 1, wherein the current limit set point signal is a fixed value during operation of the multi-semiconductor SSPC.

7. The method of claim 1, wherein the current limit set point signal can be adjusted during operation of the multi-semiconductor SSPC.

8. The method of claim 1, further comprising: receiving a switch open/close command, wherein the step of determining the current setting signal is based on a value of the switch open/close command.

9. The method of claim 1, wherein the current setting signal is determined by a current limit controller.

10. The method of claim 1, wherein the current limit set point signal can be adjusted before operation of the multi-semiconductor SSPC.

11. The method of claim 1, wherein the current limit set point signal can be adjusted after operation of the multi-semiconductor SSPC.

12. An apparatus for slew rate control of a multi-semiconductor solid state power controller (SSPC), the apparatus comprising:
   a dv/dt sensor configured to measure a rate-change of output voltage across a load of the multi-semiconductor SSPC having at least two switching semiconductors connected, and operable, in parallel;
   a dv/dt error amplifier configured to compare the rate-change of output voltage to a set rate-change of output voltage value to generate a rate-change of voltage error signal;
   a current limit controller configured to receive a current limit set point signal and configured to determine a current setting signal based on at least the rate-change of voltage error signal and the current limit set point signal.

13. The apparatus of claim 12, wherein the dv/dt sensor further comprises:
   a first input configured to receive an input voltage signal of the multi-semiconductor SSPC; and
   a second input configured to receive an output voltage signal representing a voltage across the load of the multi-semiconductor SSPC,
   wherein the dv/dt sensor is further configured to measure the rate-change of output voltage across the load of the multi-semiconductor SSPC based on the input voltage signal and the output voltage signal.

14. The apparatus of claim 12, wherein the apparatus is configured to control the rate-change of output voltage based on a value of the determined current setting signal.

15. The apparatus of claim 12, wherein the dv/dt error amplifier is further configured to amplify a difference between the rate-change of output voltage and the set rate-change of output voltage value to generate the rate-change of voltage error signal.

16. The apparatus of claim 12, wherein the current limit set point signal is a fixed value during operation of the multi-semiconductor SSPC.

17. The apparatus of claim 12, wherein the current limit set point signal can be adjusted during operation of the multi-semiconductor SSPC.

18. The apparatus of claim 12, wherein the current limit controller is further configured to receive a switch open/close command and to determine the current setting signal based on the switch open/close command.

19. The apparatus of claim 12, wherein the current limit set point signal can be adjusted before operation of the multi-semiconductor SSPC.

20. The apparatus of claim 12, wherein the current limit set point signal can be adjusted after operation of the multi-semiconductor SSPC.

* * * * *